US008470663B2

(12) United States Patent
Yun et al.

(10) Patent No.: US 8,470,663 B2
(45) Date of Patent: Jun. 25, 2013

(54) METHODS OF MANUFACTURING A SEMICONDUCTOR DEVICE

(75) Inventors: Seong-Kyu Yun, Seoul (KR); Jae-Seok Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 294 days.

(21) Appl. No.: 13/048,683

(22) Filed: Mar. 15, 2011

(65) Prior Publication Data

US 2011/0256676 A1 Oct. 20, 2011

(30) Foreign Application Priority Data

Apr. 20, 2010 (KR) ........................ 10-2010-0036331

(51) Int. Cl.
*H01L 21/8238* (2006.01)
(52) U.S. Cl.
USPC ........................................................ 438/231
(58) Field of Classification Search
USPC .................................. 438/231; 257/E21.632
See application file for complete search history.

(56) References Cited

U.S. PATENT DOCUMENTS

| 7,166,506 B2 | 1/2007 | Prince et al. | |
| 2006/0189126 A1* | 8/2006 | Jang et al. | 438/629 |
| 2009/0186458 A1 | 7/2009 | Yu et al. | |

FOREIGN PATENT DOCUMENTS

JP 2003-046079 2/2003

OTHER PUBLICATIONS

English Abstract for Publication No. 2003-046079.

* cited by examiner

*Primary Examiner* — Calvin Lee
*Assistant Examiner* — Monica D Harrison
(74) *Attorney, Agent, or Firm* — F. Chau & Associates, LLC

(57) ABSTRACT

Methods of manufacturing a semiconductor device include forming integrated structures of polysilicon patterns and hard mask patterns on a substrate divided into at least an NMOS forming region and a PMOS forming region. A first preliminary insulating interlayer is formed on the integrated structures. A first polishing of the first preliminary insulating interlayer is performed until at least one upper surface of the hard mask patterns is exposed, to form a second preliminary insulating interlayer. The second preliminary insulating interlayer is etched until the upper surfaces of the hard mask patterns are exposed, to form a third preliminary insulating interlayer. A second polishing of the hard mask patterns and the third preliminary insulating interlayer is performed until the polysilicon patterns are exposed to form an insulating interlayer. The polysilicon patterns are removed to form an opening. A metal material is deposed to form a gate electrode pattern in the opening.

20 Claims, 15 Drawing Sheets

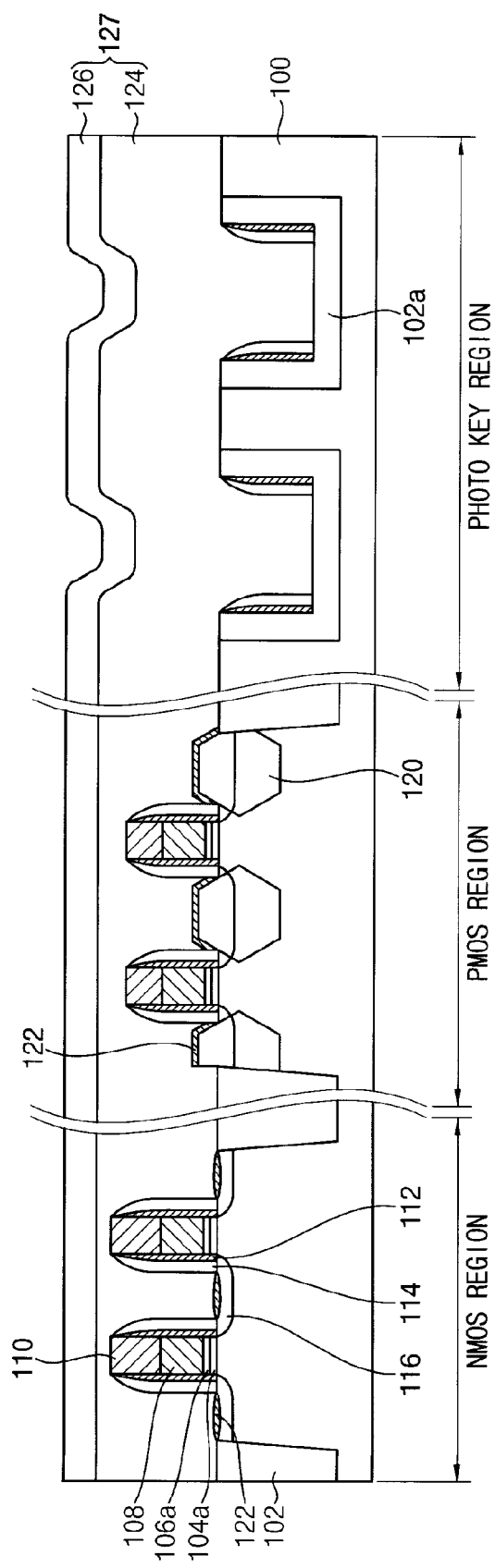

METHODS OF MANUFACTURING A SEMICONDUCTOR DEVICE

CROSS REFERENCE TO RELATED APPLICATIONS

This application claims priority under 35 USC §119 from Korean Patent Application No. 10-2010-0036331, filed on Apr. 20, 2010 in the Korean Intellectual Property Office (KIPO), the contents of which are herein incorporated by reference in their entirety.

BACKGROUND

1. Technical Field

The present disclosure is directed to methods of planarizing polysilicon patterns and methods of manufacturing a semiconductor device using the same. More particularly, the present disclosure is directed to methods of planarizing polysilicon patterns having an improved planarity within a substrate and between substrates and methods of manufacturing a semiconductor device using the same.

2. Description of the Related Art

A logic circuit transistor may be formed through a gate first process wherein a gate electrode may be patterned first before forming source/drain electrodes, etc., or through a gate last process wherein the gate electrode may be formed in the last process.

In particular, when a gate electrode is formed using a metal, directly patterning the metal may be challenging and so a gate last process may be used. When a gate electrode is formed using a gate last process, a planarization process may be stably performed to provide the gate electrodes with a uniform height. In addition, during planarization, damage to other patterns formed around the gate electrode or the generation of dishing defects should be minimized.

SUMMARY

Exemplary embodiments provide methods of manufacturing a semiconductor device including gate electrodes having a uniform height.

Exemplary embodiments provide methods of planarizing polysilicon patterns providing an insulating interlayer having a uniform thickness.

Methods of manufacturing a semiconductor device according to some embodiments include forming integrated structures of polysilicon patterns and hard mask patterns on a substrate divided into at least an NMOS forming region and a PMOS forming region. A first preliminary insulating interlayer is formed on the integrated structures. An upper surface of the first preliminary insulating interlayer is higher than an upper surface of the hard mask patterns. A first polishing of the first preliminary insulating interlayer is performed until at least one upper surface of the hard mask patterns is exposed to form a second preliminary insulating interlayer. The second preliminary insulating interlayer is etched until the upper surfaces of the hard mask patterns exposed to form a third preliminary insulating interlayer. A second polishing of the hard mask patterns and the third preliminary insulating interlayer is performed until the polysilicon patterns are exposed to form an insulating interlayer.

In exemplary embodiments, the first preliminary insulating interlayer may be formed by depositing a first insulating material layer having good gap-filling properties and then depositing a second insulating material layer having a small deposition thickness variation.

In exemplary embodiments, the first polishing may be performed by using a first slurry to polish the first preliminary insulating interlayer to a predetermined thickness without exposing the upper surface of the hard mask patterns. Then, a second slurry is used to polish the first preliminary insulating interlayer until at least one upper surface of the hard mask patterns may be exposed. The second slurry may have a slower polishing rate than the first slurry.

In exemplary embodiments, the first polishing may be performed wherein a distance variation from a surface of the substrate to an upper surface of the second preliminary insulating interlayer may be less than a thickness variation of the hard mask pattern.

In exemplary embodiments, etching the second preliminary insulating interlayer may be performed by a dry etching process having a high etch selectivity with respect to the hard mask pattern.

In exemplary embodiments, the second polishing may be performed using a third slurry having a slower polishing rate for the polysilicon patterns than for the hard mask patterns and the third preliminary insulating interlayer.

In exemplary embodiments, a process may include forming one or more spacers on sidewalls of the integrated structure.

In exemplary embodiments, a process may include forming source/drain regions for NMOS transistors and PMOS transistors by doping N-type and P-type impurities under surface portions of the respective NMOS and PMOS region of the substrate on both sides of the integrated structure.

In exemplary embodiments, a process may include forming a gate insulating layer using a metal oxide having a high dielectricity on the surface of the substrate before forming the integrated structure.

In exemplary embodiments, a process may include removing the polysilicon patterns to form an opening, depositing a metal layer to fill the opening, and polishing the metal layer to expose an upper surface of the insulating interlayer, forming a gate electrode pattern in the opening.

In exemplary embodiments, a process may include selectively growing silicon germanium on a portion of a surface of the substrate between the integrated structures formed in the PMOS forming region.

Methods of manufacturing a semiconductor device according to further embodiments include providing a substrate divided into at least an NMOS forming region and a PMOS forming region. A gate insulating layer may be formed on the substrate by depositing a metal oxide compound having a dielectricity higher than silicon nitride. A polysilicon layer and a hard mask layer may be formed over the gate insulating layer. The hard mask layer may be patterned and the polysilicon layer may be etched to form integrated structures of a polysilicon pattern and a hard mask pattern. Impurity doped regions may be formed in the substrate on both sides of the integrated structures. A first preliminary insulating interlayer may be formed covering the integrated structures as a composite layer of two or more layers by forming a first insulating material layer with good gap-filling properties and forming thereon a second insulating material layer having a small deposition thickness variation. The upper surface of the first preliminary insulating layer may be higher than an upper surface of the integrated structures.

In exemplary embodiments, impurity doped regions may be formed in the substrate by selectively doping N-type impurities into the substrate in the NMOS region to form source and drain regions of an NMOS transistor and selectively doping P-type impurities into the substrate in the PMOS region to form source and drain regions of a PMOS transistor.

A mask pattern may be formed on the substrate to selectively expose a portion of the PMOS forming region. A silicon germanium pattern may be formed on the exposed portion of the PMOS forming region.

In exemplary embodiments, a process may include first polishing the first preliminary insulating interlayer until an upper surface of one of the hard mask patterns is exposed to form a second preliminary insulating interlayer. A distance variation from a surface of the substrate to an upper surface of the second preliminary insulating interlayer may be less than a thickness variation of the hard mask pattern. The first polishing may include using a first slurry to polish the first preliminary insulating interlayer to a predetermined thickness without exposing the hard mask patterns, and using a second slurry having a slower polishing rate than the first slurry to polish the first preliminary insulating interlayer until at least one upper surface of the hard mask patterns is exposed.

In exemplary embodiments, a process may include dry etching the second preliminary insulating interlayer to remove a predetermined thickness until all of the upper surfaces of the hard mask patterns are exposed, forming a third preliminary insulating interlayer. The dry etching process may have a high etching selectivity with respect to the hard mask pattern.

In exemplary embodiments, a process may include second polishing the hard mask patterns and the third preliminary insulating interlayer to expose the polysilicon patterns, forming an insulating interlayer. The second polishing may use a third slurry having a slower polishing rate for the polysilicon patterns than for the hard mask patterns and the third preliminary insulating interlayer.

In exemplary embodiments, a process may include removing the polysilicon patterns to form an opening, depositing a metal material to form a gate electrode pattern in the opening, forming an upper insulating interlayer on the insulating interlayer, etching a portion of the upper insulating interlayer to form contact holes to expose upper surfaces of the source/drain regions and the gate electrode of the NMOS transistor and the PMOS transistor, and filling the contact holes with conductive materials to form contact plugs.

Methods of manufacturing a semiconductor device according to further embodiments include forming integrated structures of polysilicon patterns and hard mask patterns on a substrate. A first preliminary insulating interlayer may be formed on the integrated structures. An upper surface of the first preliminary insulating interlayer may be higher than an upper surface of the hard mask patterns. A first polishing of the first preliminary insulating interlayer may be performed until at least one upper surface of the hard mask patterns is exposed, forming a second preliminary insulating interlayer. The first polishing may include using a first slurry to polish the first preliminary insulating interlayer to a predetermined thickness without exposing the upper surface of the hard mask patterns, and using a second slurry having a slower polishing rate than the first slurry to polish the first preliminary insulating interlayer until at least one upper surface of the hard mask patterns is exposed. After performing the first polishing, a distance variation from a surface of the substrate to an upper surface of the second preliminary insulating interlayer may be less than a thickness variation of the hard mask pattern.

In exemplary embodiments, a process may include dry etching the second preliminary insulating interlayer until the upper surfaces of the hard mask patterns are exposed, forming a third preliminary insulating interlayer. The dry etching may have a high etch selectivity with respect to the hard mask pattern. A third slurry may be used to perform a second polishing of the hard mask patterns and the third preliminary insulating interlayer until the polysilicon patterns are exposed, forming an insulating interlayer. The third slurry may have a slower polishing rate for the polysilicon patterns than for the hard mask patterns and the third preliminary insulating interlayer.

In exemplary embodiments, a process may include forming one or more spacers on sidewalls of the integrated structure, forming source/drain regions by doping impurities under exposed surface portions of the substrate on both sides of the integrated structure, and selectively growing silicon germanium between integrated structures on a surface of a portion of a PMOS forming region the substrate.

According to methods of planarizing polysilicon patterns according to exemplary embodiments of the invention, upper surfaces of polysilicon patterns and an insulating interlayer remaining after planarizing may be substantially planar despite a large thickness variation of the hard mask patterns. In addition, a better performing transistor having a metal gate and small property variations may be manufactured by methods of planarizing polysilicon patterns according to exemplary embodiments of the invention.

BRIEF DESCRIPTION OF THE DRAWINGS

FIGS. 2A to 2L are cross-sectional views illustrating a method of manufacturing a transistor in accordance with exemplary embodiments of the invention.

DETAILED DESCRIPTION OF EXEMPLARY EMBODIMENTS

Figure 1A:
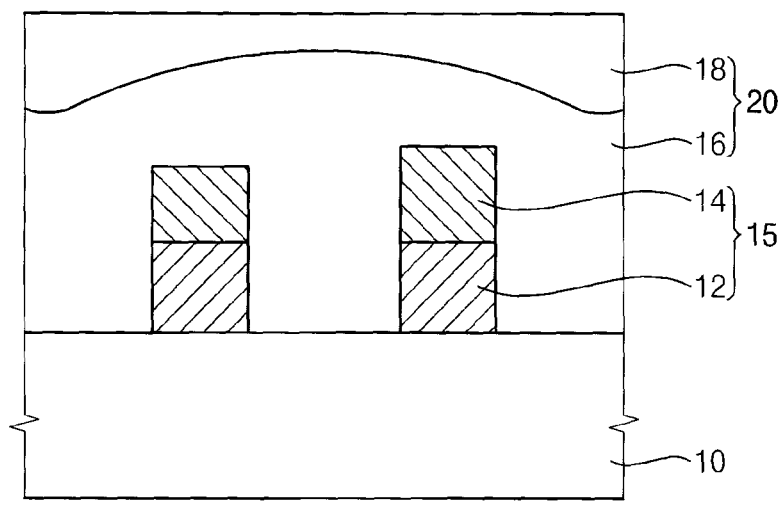
FIGS. 1A to 1D are cross-sectional views illustrating a method of planarizing polysilicon patterns in accordance with exemplary embodiments of the invention.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, exemplary embodiments of methods of planarizing polysilicon patterns and methods of manufacturing semiconductor devices will be explained in detail.

FIGS. 1A to 1D are cross-sectional views illustrating methods of planarizing polysilicon patterns in accordance with exemplary embodiments of the invention.

Referring to FIG. 1A, a polysilicon layer (not shown) and a hard mask layer (not shown) may be formed on a substrate 10. The hard mask layer may be formed using silicon nitride.

Hard mask patterns 14 may be formed by patterning the hard mask layer. The polysilicon layer may be patterned using the hard mask patterns 14 as an etching mask to form polysilicon patterns 12. These processes may form integrated structures 15 on the substrate 10 that include the polysilicon pattern 12 and the hard mask pattern 14.

The hard mask layer may have deposition thickness variations. In addition, etching the polysilicon layer may damage the hard mask patterns 14 and further vary the thicknesses of the hard mask patterns 14 in the integrated structures 15. That is, the hard mask patterns 14 may have a non-uniform thickness on the substrate 10. Further, each substrate undergoing similar processes may include the hard mask patterns 14 having large thickness variations.

A first preliminary insulating interlayer 20 covering the integrated structures 15 may be formed. The first preliminary insulating interlayer 20 may have an upper surface thereof that is higher than an upper surface of the integrated structures 15. The first preliminary insulating interlayer 20 may be formed using silicon oxide.

To easily perform a subsequent polishing process, the first preliminary insulating interlayer 20 may have a planar upper surface state. To accomplish this, the first preliminary insulating interlayer 20 may be formed as a plurality of insulating layers.

For example, the first preliminary insulating interlayer 20 may be formed by depositing a first insulating material layer 16 having good gap-filling properties, and then depositing a second insulating material layer 18 having a small deposition thickness variation. By depositing the second insulating material layer 18 as an upper insulating material layer, the thickness variation of the first preliminary insulating interlayer 20 with respect to each region of the substrate 10 may be decreased.

In particular, the first insulating material layer 16 may be formed as a high density plasma oxide layer and the second insulating material layer 18 may be formed as a tetraethyl orthosilicate (TEOS) layer. After completing the subsequent polishing process, the first insulating material layer 16 remains at both side portions of the polysilicon patterns 12. Accordingly, the first insulating material layer 16 may be formed having an upper surface that is higher than an upper surface of the polysilicon patterns 12.

Figure 1B:
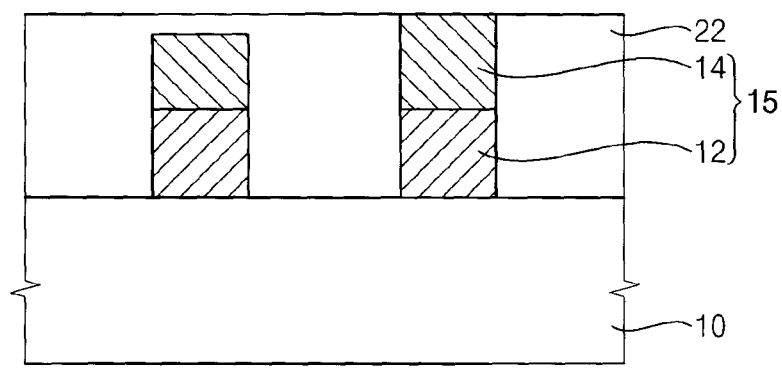

Referring to FIG. 1B, the first preliminary insulating interlayer 20 may be polished in a first polishing process until the upper surface of at least a portion of a hard mask pattern 14 is exposed to form a second preliminary insulating interlayer 22. That is, upper surfaces of the thicker hard mask patterns 14 may be exposed. However, the second preliminary insulating interlayer 22 may remain on the thinner hard mask patterns 14 so that upper surfaces of the thinner hard mask patterns 14 may remain covered.

The second preliminary insulating interlayer 22 formed through the first polishing process may have a substantially planar upper surface portion. That is, a distance variation of the second preliminary insulating interlayer 22 from a surface of the substrate 10 to the upper surface of the second preliminary insulating interlayer 22 may be less than the thickness variation of the hard mask patterns 14. The thickness variation refers to a maximum thickness difference of one layer as a function of a position on a substrate. Further, the distance variation from the surface of the substrate 10 to the upper surface of the second preliminary insulating interlayer 22 may be less than about 200 angstroms.

For example, the first polishing process may be performed using two types of slurries. A first slurry may rapidly remove the first preliminary insulating interlayer 16 to polish it to a predetermined thickness so that the hard mask patterns 14 are not exposed. In this case, the first slurry may lack a polishing rate selectivity with respect to silicon oxide and silicon nitride. The first slurry may include a fumed silica slurry.

Before or simultaneous with exposing at least one upper surface of the hard mask patterns 14, a second slurry having a slower polishing rate may polish the first preliminary insulating interlayer 20 to expose portions of the upper surfaces of the hard mask patterns 14. That is, when a portion of the upper surface of the hard mask patterns 14 is to be exposed, a polishing rate of the first preliminary insulating interlayer 20 and the hard mask patterns 14 may be reduced. The second slurry may include a ceria slurry having an automatic stopping function. Thus, a second preliminary insulating interlayer 22 formed through the polishing processes may be substantially planar.

Alternatively, the first polishing process may be performed using the first slurry until at least one upper surface of the hard mask patterns 14 is exposed, and then the second polishing process may be performed using the second slurry having the slower polishing rate than the first slurry.

Figure 1C:
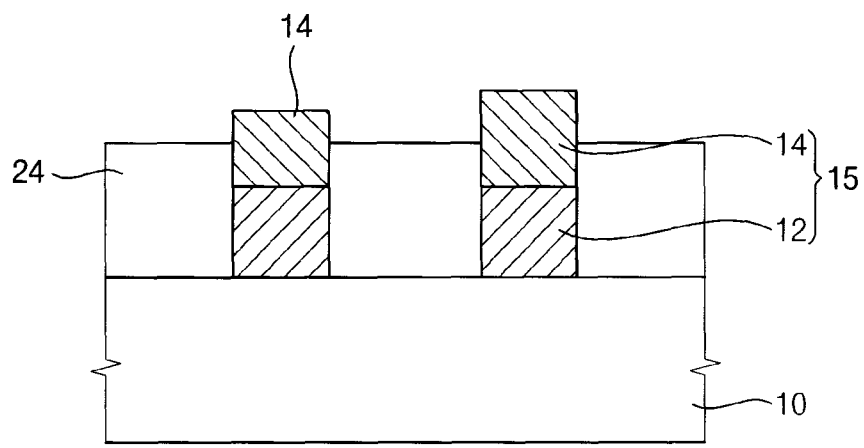

Referring to FIG. 1C, the second preliminary insulating interlayer 22 may be dry etched to a predetermined thickness until entire surface portions of the hard mask patterns 14 are exposed to form a third preliminary insulating interlayer 24. The dry etching process of the second preliminary insulating interlayer 22 may have a high etch selectivity with respect to the hard mask patterns 14. That is, the etching process barely etches the hard mask patterns 14.

Since a portion of the second preliminary insulating interlayer 22 may be removed through the dry etching process, a thickness of the third preliminary insulating interlayer 24 may be decreased with respect to the second preliminary insulating interlayer 22. Therefore, dishing defects generated due to a polishing rate difference between the hard mask patterns 14 and the third preliminary insulating interlayer 24 during a subsequently performed second polishing process may be reduced.

An upper surface of the third preliminary insulating interlayer 24 may be positioned lower than an upper surface of the hard mask patterns 14, and may be positioned higher than an upper surface of the polysilicon patterns 12.

Figure 1D:
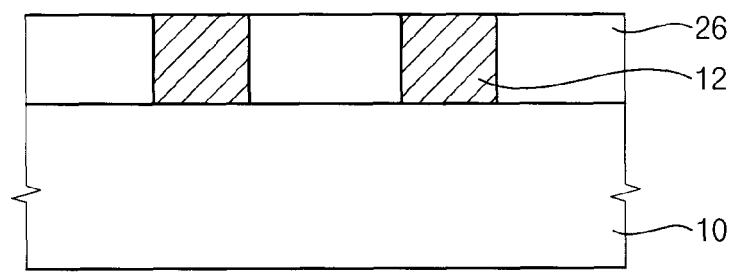

Referring to FIG. 1D, the hard mask patterns 14 and the third preliminary insulating interlayer 24 may be polished in a second polishing process until the polysilicon patterns 12 are exposed to form an insulating interlayer 26. Upper portions of the insulating interlayer 26 and the polysilicon patterns 12 may be planarized through the second polishing process. In addition, the second polishing process may completely remove the hard mask patterns 14.

The second polishing process may be performed using a third slurry that has polishing rate with respect to the polysilicon patterns 12 that is slower than that for the hard mask patterns 14 and the third preliminary insulating interlayer 24. For example, the third slurry may include a colloidal silica.

While performing the second polishing process, the hard mask patterns 14 may be polished faster than the third preliminary insulating interlayer 24. The polysilicon patterns 12 may be barely polished. The upper surface of the third preliminary insulating interlayer 24 may be positioned lower than the hard mask patterns 14. Accordingly, the polishing performed to remove the hard mask patterns 14 planarizes the remaining the upper surfaces of the polysilicon patterns 12 and the insulating interlayer 26.

In addition, the thickness of the third preliminary insulating interlayer 24 may decrease to planarize the upper surfaces of the polysilicon patterns 12 and the insulating interlayer 26.

Accordingly, the duration of the polishing may be decreased, minimizing damage to peripheral, stepped patterns due to the polishing process.

The above-described processes may increase planarization of the insulating interlayer 26 and the polysilicon patterns 12 and expose the upper surface of the polysilicon patterns 12. Various semiconductor devices may be manufacturing using a planarization method according to embodiments of the invention.

FIGS. 2A to 2L are cross-sectional views illustrating a method of manufacturing a transistor in accordance with exemplary embodiments of the invention.

Figure 2A:
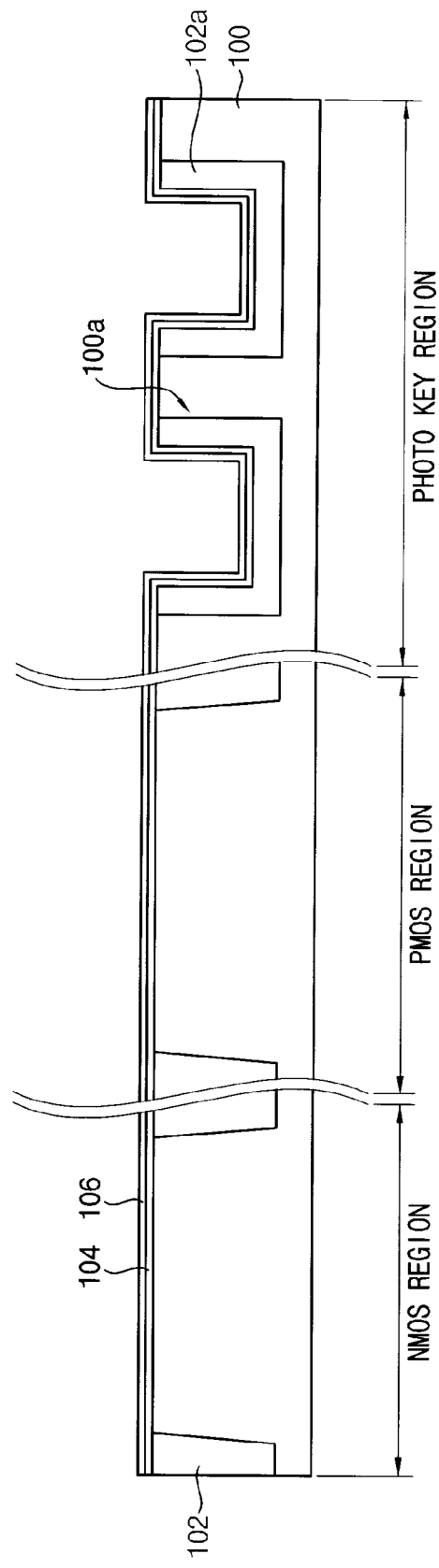

Referring to FIG. 2A, a substrate 100 comprising single crystalline silicon may be provided. The substrate 100 may be divided into an NMOS forming region, a PMOS forming region, a photo key forming region, etc. to form an NMOS transistor, a PMOS transistor, a photo key, etc.

An isolation process may be performed with respect to the substrate 100 to form an isolation layer pattern 102. The photo key forming region of the substrate 100 may be etched to form a photo key pattern 100a having a stepped portion. On a surface of the stepped portion of the photo key 100a, an insulating layer 102a may be deposited.

On the substrate 100, a gate insulating layer 104 may be formed. The gate insulating layer 104 may be formed by depositing a metal oxide compound having a dielectricity greater than silicon nitride. Examples of a metal oxide that may be used for the gate insulating layer 104 may include tantalum oxide ($Ta_2O_5$), tantalum oxynitride ($Ta_2O_5N$), aluminum oxide ($Al_2O_5$), hafnium oxide ($HfO_2$), zirconium oxide ($ZrO_2$), titanium oxide ($TiO_2$), etc. These compounds may be used alone or in combination of two or more thereof.

On the gate insulating layer 104, a passivation layer 106 may be formed to protect the gate insulating layer 104. The passivation layer 106 may protect the gate insulating layer 104 from attack during a subsequent process and may be formed using a conductive material. Examples of a material for the passivation layer 106 may include titanium, titanium nitride, tantalum, tantalum nitride, etc. These compounds may be used alone or in combination thereof. The passivation layer 106 may have a thickness from about a few angstroms to dozens of angstroms.

Figure 2B:
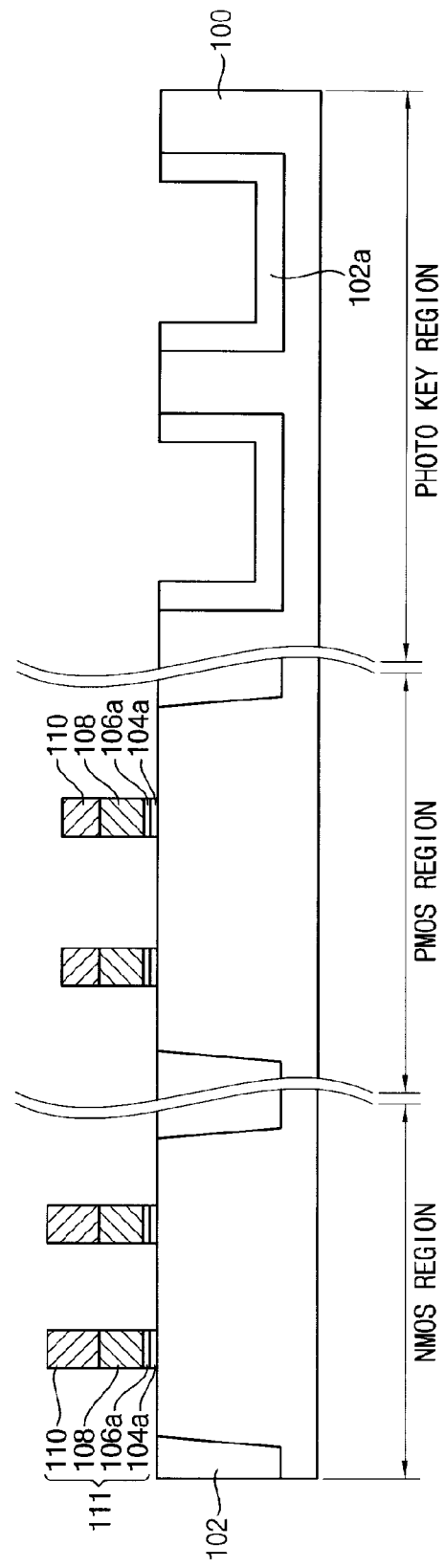

Referring to FIG. 2B, a polysilicon layer (not shown) and a hard mask layer (not shown) may be formed on the passivation layer 106. The hard mask layer may be formed using silicon nitride.

The hard mask layer may be patterned to form hard mask patterns 110. Further, the polysilicon layer may be etched using the hard mask patterns 110 as an etching mask to form polysilicon layer patterns 108. The polysilicon layer patterns 108 may be removed through a subsequent process for forming a metal gate electrode. Accordingly, the polysilicon layer patterns 108 may be formed at positions where gate electrodes of an NMOS transistor in an NMOS region and a PMOS transistor in a PMOS region are formed.

Then, the passivation layer 106 and the gate insulating layer 104 may be etched gusing the hard mask pattern 110 as an etching mask to form passivation layer patterns 106a and gate insulating layer patterns 104a.

Through performing the above-described processes, integrated structures 111 may be formed by integrating the gate insulating layer patterns 104a, the passivation layer patterns 106a, the polysilicon patterns 108 and the hard mask patterns 110.

Figure 2C:
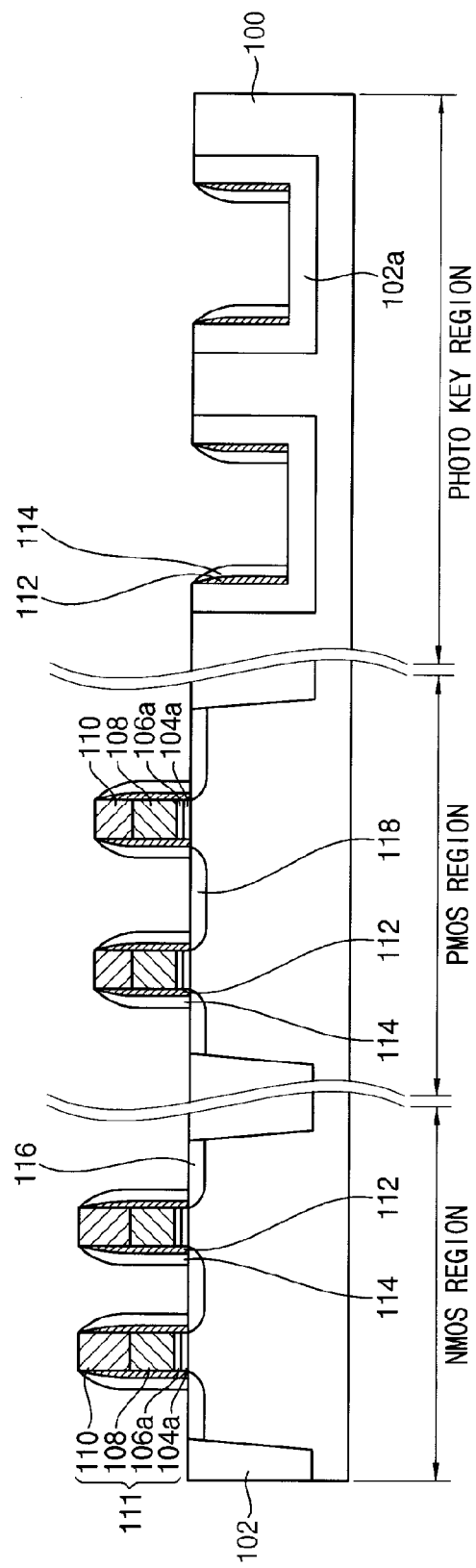

Referring to FIG. 2C, a first spacer layer (not shown) may be continuously formed on a surface of the integrated structures 111 and on a surface of the substrate 100. The first spacer layer may be formed using a material having an etch selectivity with respect to an insulating thin film interlayer. For example, the first spacer layer may be formed by depositing silicon nitride. The first spacer layer may be anisotropically etched to form a first spacer 112 at both side walls of the integrated structures 111.

Impurity doped regions may be formed in the substrate 100 on both sides of the integrated structures 111. N-type impurities may be selectively doped into the substrate in the NMOS region to form source and drain regions 116 of an NMOS transistor. In addition, P-type impurities may be selectively doped into the substrate in the PMOS region to form source and drain regions 118 of a PMOS transistor.

A second spacer layer (not shown) may be continuously formed on surface portions of the first spacer 112, an upper surface of the integrated structures 111 and on the substrate 100. The second spacer layer may be formed using an insulating material different from the first spacer layer. For example, the second spacer layer may be formed using silicon oxide. The second spacer layer may be anisotropically etched to form second spacers 114. The second spacer 114 may define a place where a silicon germanium pattern may be formed in a subsequent process. That is, the silicon germanium pattern may be formed on exposed portions of the substrate 100 between the second spacers 114.

Figure 2D:
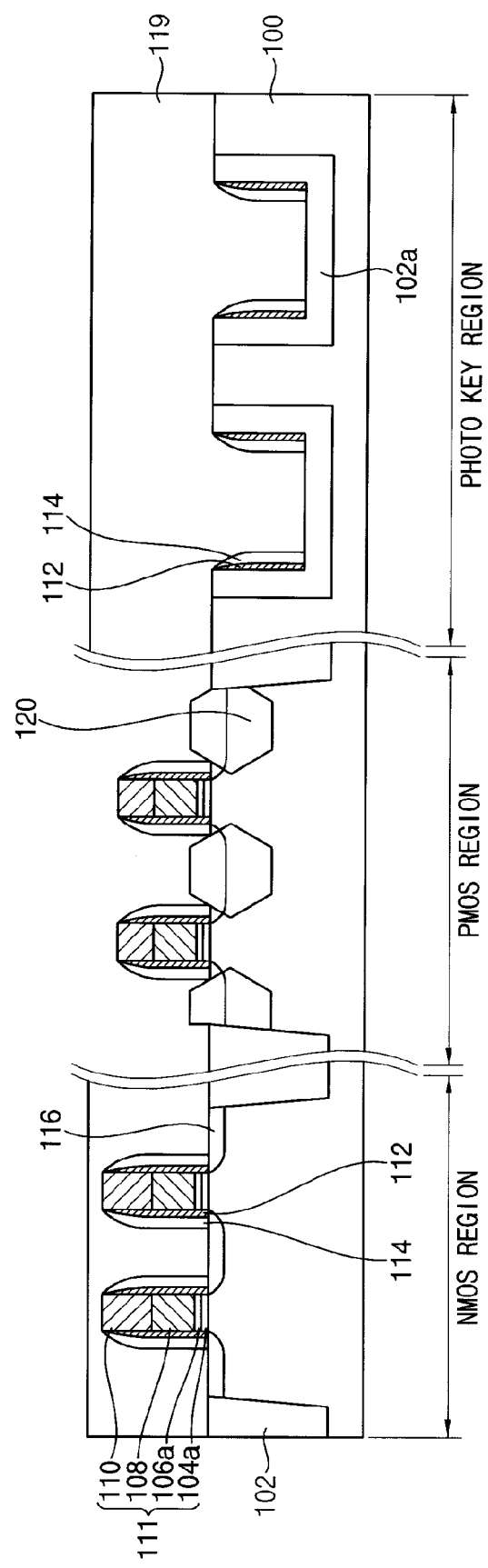

Referring to FIG. 2D, a mask pattern 119 may be formed on the substrate 100 to selectively expose a portion of the substrate 100 of the PMOS transistor region. The mask pattern 119 may cover the remaining NMOS transistor region and the photo key region of the substrate 100.

Then, silicon germanium may be selectively grown on the exposed portion of the substrate 100 in the PMOS transistor region to form a silicon germanium pattern 120. The silicon germanium pattern 120 may change lattice gaps in a channel region of the PMOS transistor. Accordingly, a hole mobility of the PMOS transistor may increase. After forming the silicon germanium pattern 120, the mask pattern 119 may be removed.

Figure 2E:
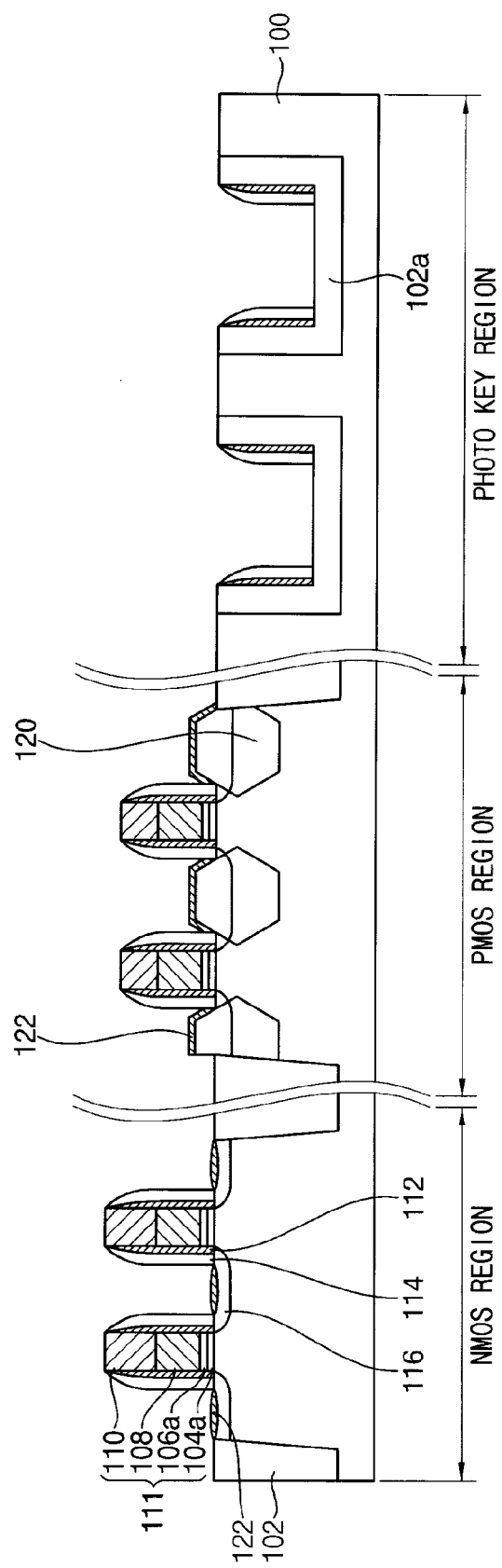

Referring to FIG. 2E, a metal layer (not shown) for forming metal silicide may be formed on surfaces of the substrate 100, the hard mask patterns 110 and the second spacers 114. Examples of a metal that may be used for the metal layer may include nickel, platinum, etc. These compounds may be used alone or as a complex thereof.

Then, the metal layer may be reacted with the substrate 100 to form metal silicide patterns 122 on the surface of the substrate 100. The metal silicide patterns 122 may be a nickel silicide pattern, a platinum silicide pattern or a nickel platinum silicide pattern. Then, unreacted metal from the metal layer may be removed. The metal silicide pattern 122 may function to decrease resistivity between source/drain regions and a contact plug formed in a subsequent process.

An etching stop layer (not shown) may be formed on surfaces of the metal silicide patterns 122, the hard mask patterns 110 and the second spacers 114. The etching stop layer may be provided to stop at an appropriate time an etching process that fauns the contact plugs to make contact with the source/drain regions.

As described above, the process for forming the first and second spacers 112 and 114, the process for growing the silicon germanium patterns 120, the process for forming the metal silicide patterns 122, etc. may be performed after forming the polysilicon patterns 108 and the hard mask patterns 110. Accordingly, the hard mask patterns 110 may be attacked and partially removed while performing the above-described processes. In this case, the hard mask patterns 110 may receive different kinds of attacks in accordance with their positions.

For example, before forming the silicon germanium patterns 120, while forming the mask patterns 119, the hard mask patterns 110 formed in the PMOS region may be exposed and may receive most of the attacks. Accordingly, after completing the processes, the hard mask patterns 110 included in the integrated structures 111 may have varying thicknesses. That is, the hard mask patterns 110 of the substrate 100 may have a non-uniform thickness.

Further, the hard mask patterns 110 may have a large thickness variation for different substrates after the same processes were performed. For example, the hard mask patterns 110 may show a thickness variation of from about 300 angstroms to about 500 angstroms. When the thickness variation of the hard mask patterns 110 is large, a common polishing process may result in a lack of planarity. In addition, a large thickness variation may obscure a polishing stop point. Accordingly, defects may be generated, such as over-polishing and under-polishing.

Referring to FIG. 2F, a first preliminary insulating interlayer 127 covering the integrated structures 111 may be formed. An upper surface portion of the first preliminary insulating interlayer 127 may be positioned higher than an upper surface of the integrated structures 111. The first preliminary insulating interlayer 127 may be formed using silicon oxide.

To easily perform a subsequent polishing process, the first preliminary insulating interlayer 127 may be deposited to form a planar upper surface. To accomplish this, the first preliminary insulating interlayer 127 may be formed as a composite layer of two or more layers. For example, a first insulating material layer 124 having good gap-filling properties may be formed and then a second insulating material layer 126 having a small deposition thickness variation may be integrally formed thereon. Depositing the second insulating material layer 126 having a small thickness variation on an upper portion of the first insulating material layer 124 may decrease the thickness variations of the first preliminary insulating interlayer 124 as functions of positions of the substrate. In particular, the first insulating material layer 124 may be formed as a high density plasma oxide layer and the second insulating material layer 126 may be formed as a tetraethyl orthosilicate (TEOS) layer.

The first insulating material layer 124 may be formed to fill gaps between the integrated structures. In addition, the upper surface of the first insulating material layer 124 may be formed to be higher than the upper surface of the polysilicon patterns 108. In this case, after completing the subsequent planarization process, the whole second insulating material layer 126 may be removed, leaving the first insulating material layer 124 on both sides of the polysilicon patterns 108.

Figure 2G:
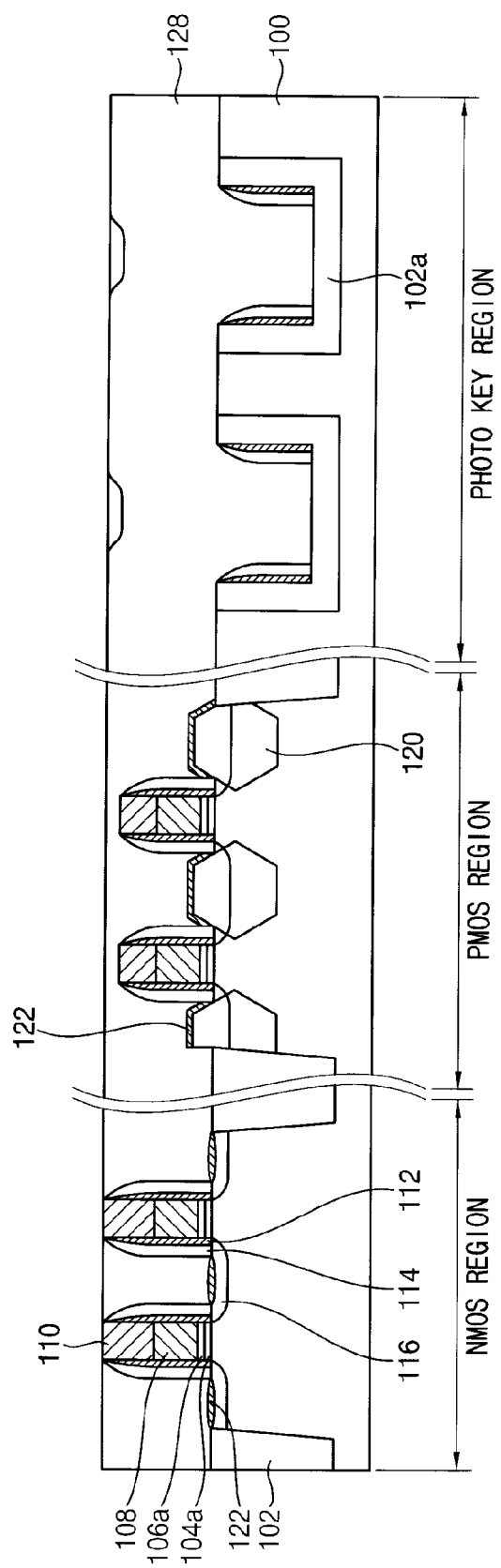

Referring to FIG. 2G, the first preliminary insulating interlayer 127 may be polished in a first polishing process until an upper surface of at least one of the hard mask patterns 110 is exposed to form a second preliminary insulating interlayer 128. That is, the thicker hard mask patterns 110 have their upper surfaces exposed. However, the second preliminary insulating interlayer 128 may remain on the thinner hard mask patterns so that their upper surfaces may remain covered.

The upper surface portions of the second preliminary insulating interlayer 128 formed through the first polishing process may be substantially planar. That is, the distance variation from the surface of the substrate 100 to the upper surface of the second preliminary insulating interlayer 128 may be less than the thickness variation of the hard mask patterns 110 on the substrate 100. In addition, the distance variation from the surface of the substrate 100 to the upper surface of the second preliminary insulating interlayer 128 may be less than about 200 angstroms. That is, the thickness of the second preliminary insulating interlayer 128 remaining on the upper surface of the polysilicon patterns 108 may be from about 0 to about 200 angstroms.

The first polishing process may be performed using two types of slurries. A first slurry may rapidly remove and polish the first preliminary insulating interlayer 127 to a predetermined thickness so not to expose the hard mask patterns 110. In this case, the first slurry may lack polishing selectivity with respect to silicon oxide and silicon nitride. The first slurry may be a silica slurry. Then, a second slurry having a slower polishing rate than the first slurry may polish the first preliminary insulating interlayer 127 to expose at least an upper portion of the hard mask patterns 110. One or more, but not all of the upper surfaces of the hard mask patterns 110 may be exposed. That is, the number of exposed upper surfaces may be at least one but less than all of the upper surfaces of the hard mask patterns 110.

When an upper surface of the portion of the hard mask patterns 110 is to be exposed, the polishing rate of the first preliminary insulating interlayer 127 and the hard mask pattern 110 may be decreased. Through the above-described processes, the thus formed second preliminary insulating interlayer 128 may be substantially planar. The second slurry may be an auto stopping ceria slurry.

Alternatively, the first polishing process may be performed using the second slurry, while reducing its polishing rate when the upper surface of the hard mask patterns 110 is exposed.

Figure 2H:
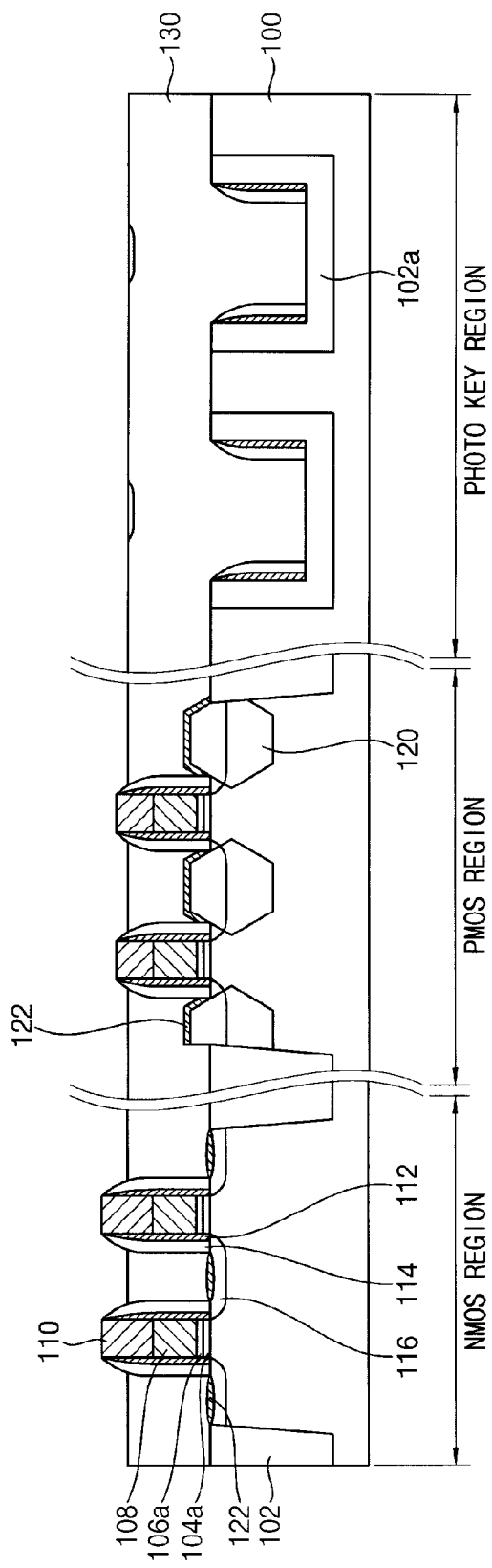
Figure 21:
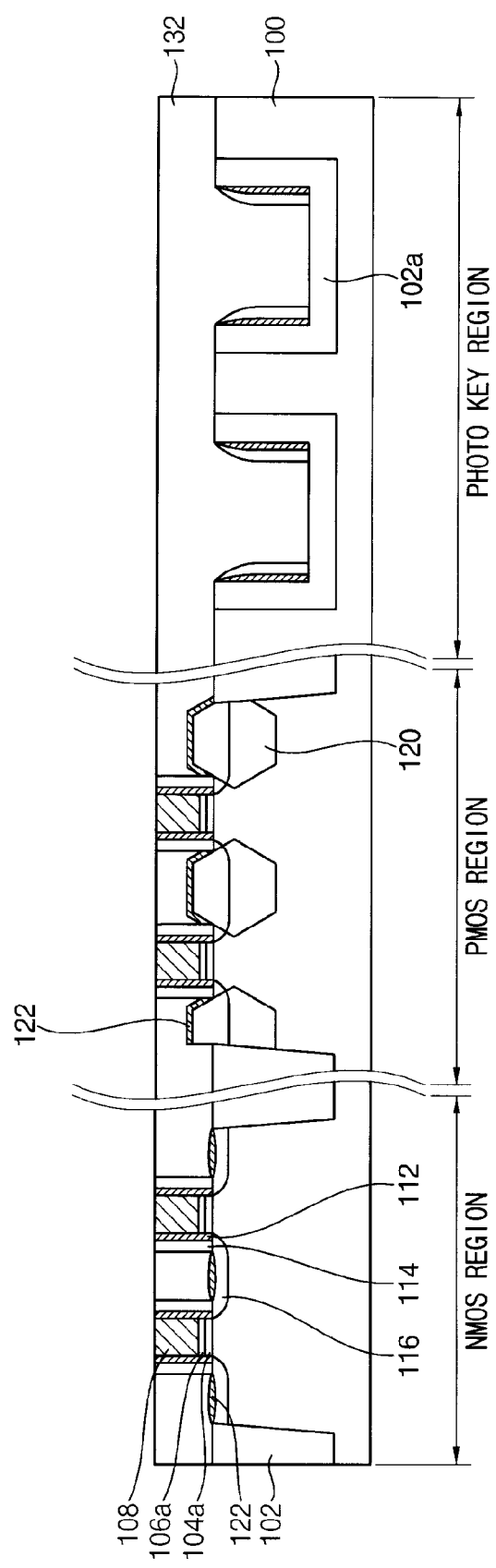

Referring to FIG. 2H, the second preliminary insulating interlayer 128 may be dry etched to remove a predetermined thickness until all of the upper surfaces of the hard mask patterns 110 are exposed. A third preliminary insulating interlayer 130 may be formed through the dry etching process. The dry etching process may have a high etch selectivity with respect to the second preliminary insulating interlayer 128 and the hard mask patterns 110. That is, the dry etching process barely etches the hard mask patterns 110.

An upper surface of the third preliminary insulating interlayer 130 may be positioned lower than the upper surface of the hard mask patterns 110, but may be positioned higher than the upper surface of the polysilicon patterns 108.

Through the dry etching process, a predetermined thickness of the second preliminary insulating interlayer 128 may be removed, decreasing a thickness of the third preliminary insulating interlayer to be removed during a subsequent second polishing process. Therefore, dishing defects resulting from polishing rate differences of the hard mask patterns 110 and the third preliminary insulating interlayer 130 may be decreased during the second polishing process. Referring to FIG. 2I, the hard mask patterns 110 and the third preliminary insulating interlayer 130 may be polished in a second polishing process to expose the polysilicon patterns 108 and to form an insulating interlayer 132. Upper surfaces of the insulating interlayer 132 and the polysilicon patterns 108 may be substantially planar.

The second polishing process may be performed using a third slurry having a slower polishing rate for the polysilicon patterns 108 than for the hard mask patterns 110 and the third preliminary insulating interlayer 130. For example, the third slurry may include a colloidal silica.

While performing the second polishing process, the hard mask patterns 110 may be polished faster than the third preliminary insulating interlayer 130. However, the upper surface of the third preliminary insulating interlayer 130 may be positioned lower than the upper surface of the hard mask patterns 110. Accordingly, planarized upper surfaces of the remaining polysilicon patterns 108 and the insulating interlayer 132 are obtained after performing the polishing process to remove the hard mask patterns 110.

In addition, the thickness of the third preliminary insulating interlayer 130 being polished decreases to planarize the upper surfaces of the polysilicon patterns 108 and the insulating interlayer 132. Accordingly, the duration of the polishing process may be decreased, minimizing damage to each stepped, peripheral pattern due to the polishing process. In particular, since the duration of the polishing process may be decreased, defects due to the polishing, such as a photo key pattern collapse or a step decrease, may be reduced. In addition, since the duration of the polishing process may be decreased, less of an etch stop layer (not shown), formed from the same material as the hard mask patterns, may be removed, thus suppressing dents generated by removing portions of the etch stop layer.

Further, since excessive polishing may be restrained, defects due to excessive polishing, such as exposing the silicon germanium patterns 120 or the metal silicide patterns 122, may be substantially eliminated.

Figure 2J:
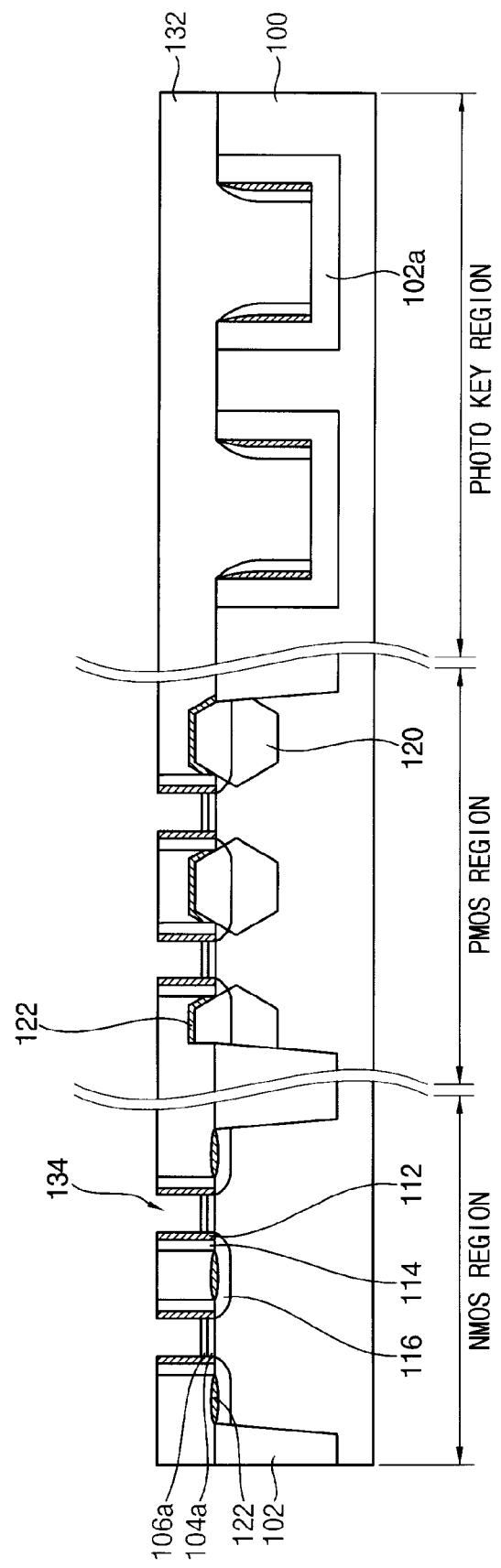

Referring to FIG. 2J, the exposed polysilicon pattern 108 may be selectively removed to form an opening 134. The selective removal of the polysilicon pattern 108 may be performed by a wet etching process or a dry etching process. Alternatively, a dry etching process may remove oxide on the polysilicon patterns 108, and then the wet etching process may remove the polysilicon patterns 108. The passivation layer may be exposed at a bottom portion of the opening 134.

The insulating interlayer 132 having the opening 134 may have a substantially planar upper surface and little thickness variation. Accordingly, a gate electrode having a uniform thickness may be easily formed in the opening 134 by the following processes.

Figure 2K:
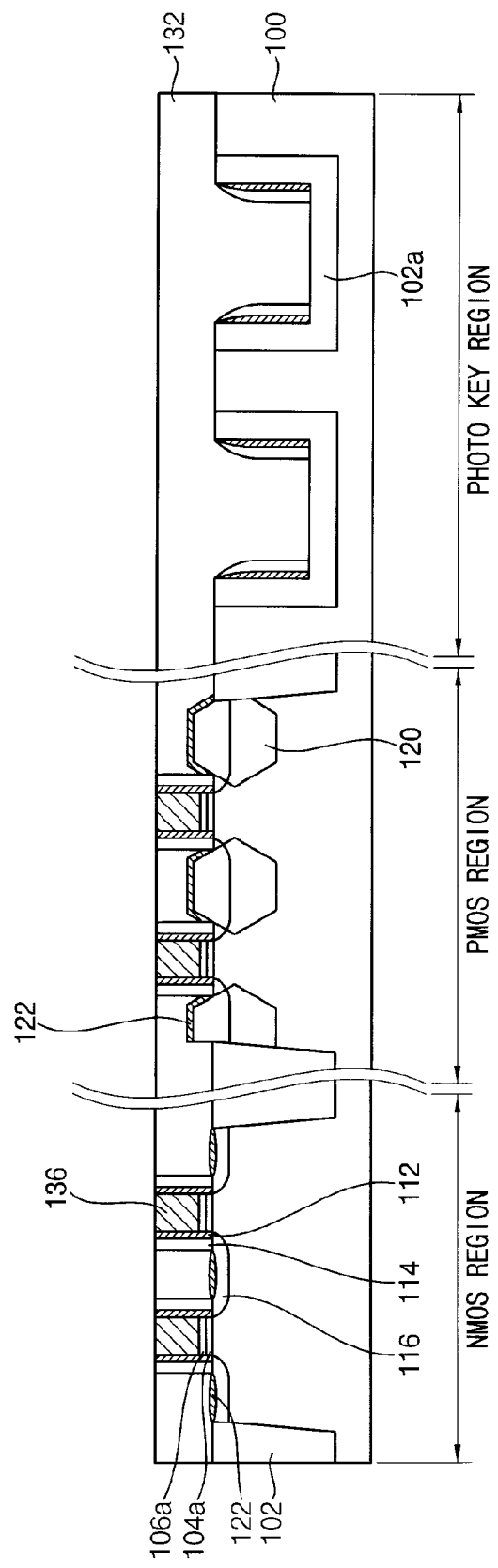

Referring to FIG. 2K, a metal layer (not shown) may be formed to fill the opening 134. The metal layer may be formed using a metal material that may control an appropriate work function of the NMOS transistor and the PMOS transistor. For example, the metal layer may be formed as an aluminum layer. Before forming the metal layer, a barrier metal layer (not shown) may also be formed. Examples of a barrier metal layer material may include titanium, titanium nitride, tantalum, tantalum nitride, etc. These may be used alone or in combination thereof.

The metal layer may be polished to expose an upper surface portion of the insulating interlayer 132 to form a gate electrode 136 from the metal material in the opening 134. Both an NMOS transistor and a PMOS transistor may be obtained. As described above, the gate electrode 136 having a metal may be formed in a final step of processes for forming the transistor.

Figure 2L:
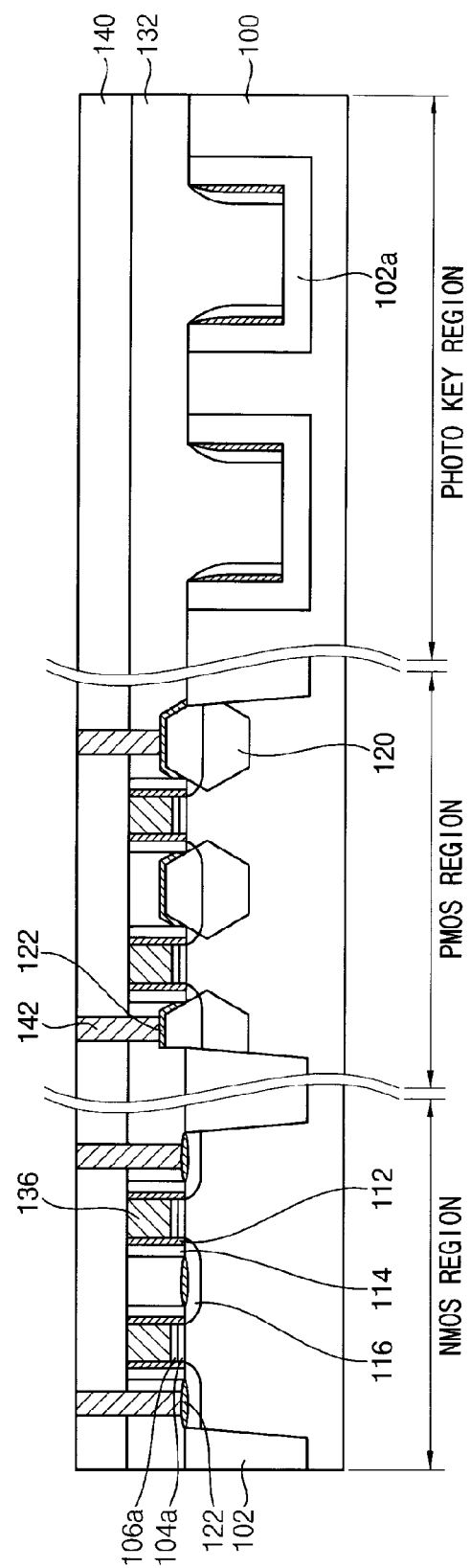

Referring to FIG. 2L, an upper insulating interlayer 140 may be formed on the insulating interlayer 132. A portion of the upper insulating interlayer 140 may be etched to form contact holes to expose upper surfaces of the source/drain regions and the gate electrode 136 of the NMOS transistor and the PMOS transistor. The insides of the contact holes may be filled with conductive materials to form contact plugs 142.

After performing the polishing to expose the polysilicon patterns, the insulating interlayer may be substantially planar in accordance with exemplary embodiments. In addition, dent defects may be substantially eliminated after the polishing is completed. Accordingly, a gate electrode may be formed in a final step of a gate last process for forming a transistor. Then, the gate electrode may be formed that has a uniform thickness over an entire region of the substrate and a small thickness variation through the substrates. An NMOS transistor and a PMOS transistor having few characteristic deviations and good characteristics may be obtained.

Figure 3:
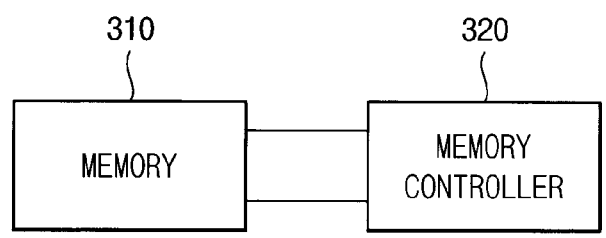
FIG. 3 is a block diagram illustrating a memory system employing a semiconductor device in accordance with exemplary embodiments of the invention.

FIG. 3 is a block diagram illustrating a memory system employing a semiconductor device in accordance with exemplary embodiments of the invention.

Referring to FIG. 3, a memory system in accordance with exemplary embodiments of the invention may include a memory 310 and a memory controller 320 connected to the memory 310. The memory 310 may include transistors manufactured in accordance with exemplary embodiments of the invention. The memory controller 320 may provide input signals to control operations of the memory. The memory controller 320 may control the memory 310 based on the provided control signals.

Figure 4:
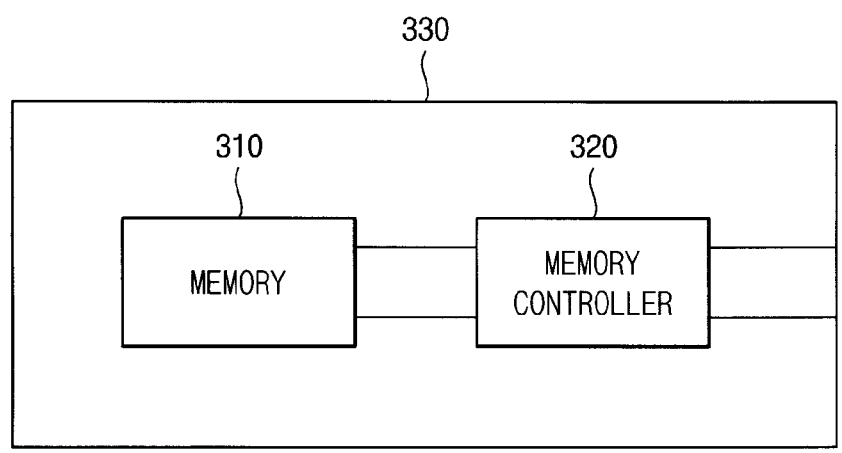
FIG. 4 is a block diagram illustrating a memory system employing a semiconductor device in accordance with other embodiments of the invention.

FIG. 4 is a block diagram illustrating a memory system employing a semiconductor device in accordance with other exemplary embodiments of the invention.

Referring to FIG. 4, a system may include a memory 310 and a memory controller 320 as illustrated in FIG. 3, however, the memory 310 and the memory controller 320 may be fabricated in a memory card 330. For example, the memory card 330 may be a memory card including transistors manufactured in accordance with exemplary embodiments of the invention. The memory card 330 may include an SRAM. The memory card 330 may be a card applicable for an industrial standard and may be used in various electronic appliances, such as a digital camera, a personal computer, etc. The memory controller 320 may control the memory 310 based on input control signals received by the card from another exterior apparatus.

As described above, gate electrodes having a uniform height may be formed in accordance with exemplary embodiments of the invention. High performance transistors including the gate electrodes may be formed. Various semiconductor memory devices and logic devices including the transistors may be manufactured.

The foregoing is illustrative of exemplary embodiments of the invention and is not to be construed as limiting thereof. Although a few exemplary embodiments have been described, those skilled in the art will readily appreciate that many modifications are possible in the exemplary embodiments without materially departing from the novel teachings of the present inventive concept. Therefore, it is to be understood that the foregoing is illustrative of various exemplary embodiments of the invention, and is not to be construed as limited to the specific exemplary embodiments disclosed, and that modifications to the disclosed exemplary embodiments, as well as other exemplary embodiments of the invention, are intended to be included within the scope of the appended claims.

What is claimed is:

1. A method of manufacturing a semiconductor device, comprising:
    forming integrated structures of polysilicon patterns and hard mask patterns on a substrate divided into at least an NMOS forming region and a PMOS forming region;
    forming a first preliminary insulating interlayer on the integrated structures, an upper surface of the first preliminary insulating interlayer being higher than an upper surface of the hard mask patterns;
    performing a first polishing of the first preliminary insulating interlayer until at least one upper surface of the hard mask patterns is exposed, forming a second preliminary insulating interlayer;
etching the second preliminary insulating interlayer until the upper surfaces of the hard mask patterns are exposed, forming a third preliminary insulating interlayer; and
performing a second polishing of the hard mask patterns and the third preliminary insulating interlayer until the polysilicon patterns are exposed, forming an insulating interlayer.

2. The method of claim 1, wherein the first preliminary insulating interlayer is formed by depositing a first insulating material layer having good gap-filling properties and depositing a second insulating material layer having a small deposition thickness variation.

3. The method of claim 1, wherein the first polishing comprises:
using a first slurry to polish the first preliminary insulating interlayer to a predetermined thickness without exposing the upper surface of the hard mask patterns; and
using a second slurry to polish the first preliminary insulating interlayer until at least one upper surface of the hard mask patterns is exposed, wherein the second slurry has a slower polishing rate than the first slurry.

4. The method of claim 1, wherein the first polishing is performed wherein a distance variation from a surface of the substrate to an upper surface of the second preliminary insulating interlayer is less than a thickness variation of the hard mask pattern.

5. The method of claim 1, wherein etching the second preliminary insulating interlayer is performed by a dry etching process having a high etch selectivity with respect to the hard mask pattern.

6. The method of claim 1, wherein the second polishing is performed using a third slurry having a slower polishing rate for the polysilicon patterns than for the hard mask patterns and the third preliminary insulating interlayer.

7. The method of claim 1, further comprising forming one or more spacers on sidewalls of the integrated structure.

8. The method of claim 1, further comprising forming source/drain regions for an NMOS transistor and a PMOS transistor by doping N-type and P-type impurities into surface portions of the respective NMOS and PMOS regions the substrate on both sides of the integrated structure.

9. The method of claim 1, prior to forming the integrated structure, further comprising forming a gate insulating layer on the surface of the substrate using a metal oxide having a high dielectricity.

10. The method of claim 1, further comprising:
removing the polysilicon patterns to form an opening;
depositing a metal layer to fill the opening; and
polishing the metal layer to expose an upper surface of the insulating interlayer, forming a gate electrode pattern in the opening.

11. The method of claim 1, further comprising selectively growing silicon germanium on a surface of a portion of the substrate between integrated structures formed in the PMOS forming region.

12. A method of manufacturing a semiconductor device, comprising:
providing a substrate divided into at least an NMOS forming region and a PMOS forming region;
forming a gate insulating layer on the substrate by depositing a metal oxide compound having a dielectricity higher than silicon nitride;
forming a polysilicon layer and a hard mask layer over the gate insulating layer;
patterning the hard mask layer and etching the polysilicon layer to form integrated structures of a polysilicon pattern and a hard mask pattern;
forming impurity doped regions in the substrate on both sides of the integrated structures; and
forming a first preliminary insulating interlayer covering the integrated structures as a composite layer of two or more layers by forming a first insulating material layer with good gap-filling properties and forming thereon a second insulating material layer having a small deposition thickness variation, wherein the upper surface of the first preliminary insulating layer is higher than an upper surface of the integrated structures.

13. The method of claim 12, wherein forming impurity doped regions in the substrate comprises:
selectively doping N-type impurities into the substrate in the NMOS region to form source and drain regions of an NMOS transistor;
electively doping P-type impurities into the substrate in the PMOS region to form source and drain regions of a PMOS transistor;
forming a mask pattern on the substrate to selectively expose a portion of the PMOS forming region; and
forming a silicon germanium pattern on the exposed portion of the PMOS forming region.

14. The method of claim 12, further comprising first polishing the first preliminary insulating interlayer until an upper surface of one of the hard mask patterns is exposed to form a second preliminary insulating interlayer, wherein a distance variation from a surface of the substrate to an upper surface of the second preliminary insulating interlayer is less than a thickness variation of the hard mask pattern, wherein the first polishing comprises:
using a first slurry to polish the first preliminary insulating interlayer to a predetermined thickness without exposing the hard mask patterns; and
using a second slurry having a slower polishing rate than the first slurry to polish the first preliminary insulating interlayer until at least one upper surface of the hard mask patterns is exposed.

15. The method of claim 14, further comprising dry etching the second preliminary insulating interlayer to remove a predetermined thickness until all of the upper surfaces of the hard mask patterns are exposed, forming a third preliminary insulating interlayer, wherein the dry etching process has a high etch selectivity with respect to the second preliminary insulating interlayer and the hard mask patterns.

16. The method of claim 15, further comprising second polishing the hard mask patterns and the third preliminary insulating interlayer to expose the polysilicon patterns, forming an insulating interlayer, wherein the second polishing uses a third slurry having a slower polishing rate for the polysilicon patterns than for the hard mask patterns and the third preliminary insulating interlayer.

17. The method of claim 16, further comprising:
removing the polysilicon patterns to form an opening;
depositing a metal material to form a gate electrode pattern in the opening;
forming an upper insulating interlayer on the insulating interlayer;
etching a portion of the upper insulating interlayer to form contact holes to expose upper surfaces of the source/drain regions and the gate electrode of the NMOS transistor and the PMOS transistor; and
filling the contact holes with conductive materials to form contact plugs.

18. A method of manufacturing a semiconductor device, comprising:
- forming integrated structures of polysilicon patterns and hard mask patterns on a substrate;
- forming a first preliminary insulating interlayer on the integrated structures, an upper surface of the first preliminary insulating interlayer being higher than an upper surface of the hard mask patterns;
- performing a first polishing of the first preliminary insulating interlayer until at least one upper surface of the hard mask patterns is exposed, forming a second preliminary insulating interlayer, wherein the first polishing comprises:
  - using a first slurry to polish the first preliminary insulating interlayer to a predetermined thickness without exposing the upper surface of the hard mask patterns; and
  - using a second slurry having a slower polishing rate than the first slurry to polish the first preliminary insulating interlayer until at least one upper surface of the hard mask patterns is exposed,
  - wherein after performing the first polishing, a distance variation from a surface of the substrate to an upper surface of the second preliminary insulating interlayer is less than a thickness variation of the hard mask pattern.

19. The method of claim 18, further comprising:
- dry etching the second preliminary insulating interlayer in a process having a high etch selectivity with respect to the hard mask pattern until the upper surfaces of the hard mask patterns are exposed, forming a third preliminary insulating interlayer; and
- using a third slurry to perform a second polishing of the hard mask patterns and the third preliminary insulating interlayer until the polysilicon patterns are exposed, forming an insulating interlayer, wherein the third slurry has a slower polishing rate for the polysilicon patterns than for the hard mask patterns and the third preliminary insulating interlayer.

20. The method of claim 18, further comprising:
- forming one or more spacers on sidewalls of the integrated structure;
- forming source/drain regions by doping impurities under exposed surface portions of the substrate on both sides of the integrated structure; and
- selectively growing silicon germanium between integrated structures on a surface of a portion of a PMOS forming region the substrate.

* * * * *